(12) United States Patent
Redoute et al.

(10) Patent No.: US 7,068,130 B2
(45) Date of Patent: Jun. 27, 2006

(54) ACTIVE INDUCTOR

(75) Inventors: Jean-Michel Vladimir Redoute, Berchem (BE); Joannes Mathilda Josephus Sevenhans, Brasschaat (BE)

(73) Assignee: Alcatel, Paris (FR)

( * ) Notice: Subject to any disclaimer, the term of this patent is extended or adjusted under 35 U.S.C. 154(b) by 65 days.

(21) Appl. No.: 10/823,643

(22) Filed: Apr. 14, 2004

(65) Prior Publication Data
US 2004/0212462 A1    Oct. 28, 2004

(30) Foreign Application Priority Data
Apr. 25, 2003  (EP) .................................. 03291034

(51) Int. Cl.
*H03H 11/00*    (2006.01)
(52) U.S. Cl. ...................... 333/214; 333/215
(58) Field of Classification Search ................ 333/213, 333/214, 215, 216, 217
See application file for complete search history.

(56) References Cited

U.S. PATENT DOCUMENTS

| 5,202,655 | A | * | 4/1993 | Hara ........................... 333/215 |
| 5,256,991 | A | * | 10/1993 | Campbell et al. ........... 333/215 |
| 5,392,171 | A | * | 2/1995 | Kovner et al. ................ 360/65 |
| 5,726,613 | A | * | 3/1998 | Hayashi et al. ............. 333/214 |
| 6,028,496 | A |   | 2/2000 | Ko et al. |
| 6,211,753 | B1 | * | 4/2001 | Leifso et al. ............... 333/214 |

FOREIGN PATENT DOCUMENTS

EP         1 248 367 A1    10/2002

OTHER PUBLICATIONS

El Khoury S: "The Design of Active Floating Positive and Negative Inductors In MMIC Technology" IEEE Microwave and Guided Wave Letters, IEEE Inc., New York, US, vol. 5, No. 10, Oct. 1, 1995, pp. 321-323, XP000525038.
Campbell C F et al: "Design of a broadband microwave BJT active inductor circuit" Circuits and Systems, 1991., Proceedings of the 34th Midwest Symposium on Monterey, CA, USA May 14-17, 1991, New York, NY, USA, IEEE, US, May 14, 1991, pp. 407-409, XP010063336.

(Continued)

*Primary Examiner*—Dean Takaoka
(74) *Attorney, Agent, or Firm*—Sughrue Mion, PLLC

(57) ABSTRACT

An active inductor circuit (L) includes first (T1) and second (T2) terminals for coupling to respective external terminals (Hi,Lo), said first and second terminals being coupled to a first transconductance circuit (gm1), a second transconductance circuit (gm2) and a feedback circuit (fb) included in said active inductor circuit. An output terminal (OUT1) of said first transconductance circuit (gm1) is coupled to an input terminal of said second transconductance circuit (gm2), an output terminal (OUT2) of said second transconductance circuit (gm2) is coupled to an input terminal (IN1) of said first transconductance circuit (gm1) via said feedback circuit (fb), and said active inductor circuit further including a capacitor (C1) coupled between said output terminal (OUT) of said first transconductance circuit (gm1) and said second terminal (T2).

7 Claims, 4 Drawing Sheets

OTHER PUBLICATIONS

Santos P F et al: "Design and tuning techniques for a 100MHz CMOS continuous-time narrow-bandwidth bandpass filter" Circuits and Systems, 1995., Proceedings of the 38th Midwest Symposium on Rio De Janeiro, Brazil Aug. 13-16, 1995, New York, NY, USA, IEEE, US, Aug. 13, 1995, pp. 917-920, XP010165408.

M A Tan, R Shaumann: "Generation of Transconductance Grounded-Capacitor Filters by Signal-Flow-Graph Methods for VLSI Implementation" Electronics Letters, vol. 23, No. 20, Sep. 24, 1987, pp. 1093-1094, XP002254300.

* cited by examiner

ACTIVE INDUCTOR

BACKGROUND OF THE INVENTION

The present invention relates to an active inductor circuit, and more particularly an active inductor circuit as described in the preamble of claim 1.

Active inductors are already known in the art, for instance in the published European Patent Application 1248367. Therein a circuit synthesising an inductor is described, including an operational amplifier, resistors and capacitors in a specific circuit configuration. An alternative circuit is described in U.S. Pat. No. 6,028,496. A drawback of both alternatives is however is that the operational amplifiers need to be biased externally by a separate DC supply. In some applications where active inductors are needed, such as in splitters in DSL equipment where only the line feed terminals are available, there is no such external and separate DC bias or supply available.

BRIEF SUMMARY OF THE INVENTION

An object of the present invention is to provide an active inductor which may be synthesised between varying high and low line feed terminals, and which does not require a separate external DC bias for its operation.

According to the invention, this object is achieved due to the fact that said active inductor includes the features as described in claim 1.

In this way, a simple circuit is provided whereby the active inductor is realised between the two end terminals, without the need of any separate DC supply for the DC bias.

A further characteristic feature of the present invention is described in claim 2.

Thereby a very simple implementation for the first transconductance circuit is provided.

Another characteristic features of the present invention is described in claim 3.

This describes a very simple implementation of the second transconductance circuit.

It may be noted that the capacitor needed in the circuit can as well be realised as an input capacitor of the active device of the second transconductance circuit.

An additional characteristic feature of the present invention is mentioned in claim 4.

A very simple implementation of the feedback circuit is herewith provided.

Yet another feature of the present invention is described in claim 5.

The DC supply voltage, generated by the active inductor circuit thereby shows a linear relationship with the DC output current through the second transconductance circuit.

This current is significantly larger than the current through the other building blocks as described in claim 6. Claim 7 describes the relationship between the equivalent inductance of the circuit thus realised and the parameters of the building blocks.

A further characteristic feature is that said active inductor further includes the features as described in claim 8.

In this way a bidirectional embodiment is provided, still allowing a good operation when the voltage between the input terminals is reversed.

A symmetrical operation is obtained by symmetry in the architecture as is stated in claim 9.

It is to be noticed that the term 'coupled', used in the claims, should not be interpreted as being limitative to direct connections only. Thus, the scope of the expression 'a device A coupled to a device B' should not be limited to devices or systems wherein an output of device A is directly connected to an input of device B. It means that there exists a path between an output of A and an input of B which may be a path including other devices or means.

It is to be noticed that the term 'comprising', used in the claims, should not be interpreted as being limitative to the means listed thereafter. Thus, the scope of the expression 'a device comprising means A and B ' should not be limited to devices consisting only of components A and B. It means that with respect to the present invention, the only relevant components of the device are A and B.

The above and other objects and features of the invention will become more apparent and the invention itself will be best understood by referring to the following description of an embodiment taken in conjunction with the accompanying drawings wherein

DETAILED DESCRIPTION OF THE INVENTION

Figure 1:
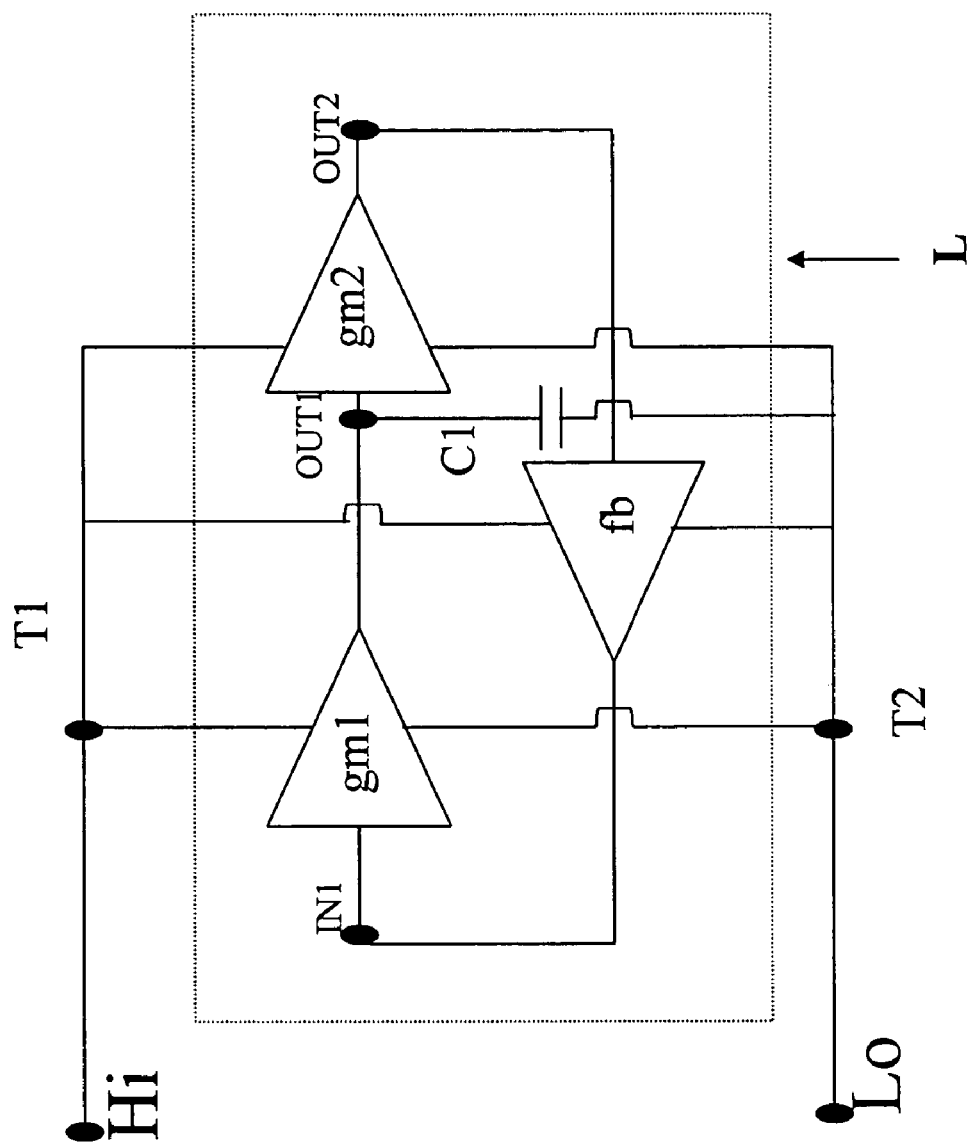
FIG. 1 gives a basic scheme of an active inductor circuit according to the invention, FIG. 2 schematically depicts a first transistor-level embodiment of an active inductor circuit according to the invention, FIG. 3 gives a basic scheme of a bidirectional active inductor circuit according to the invention.

The active inductor L basically comprises 3 main building blocks, as can be observed from FIG. 1: a first transconductance circuit denoted gm1, a second transconductance circuit denoted gm2, and a feedback circuit, denoted fb.

The active inductor itself is realised between two inductor terminals T1 and T2, which are respectively coupled to external terminals Hi and Lo, for instance being line feed terminals in the case of an active inductor for splitter applications. It is to be noted that for these applications the DC current through these line feed terminals is used such as to generate the bias needed for the 3 building blocks. This is schematically indicated in FIG. 1 by means of the vertical lines between the input terminals and the building blocks indicating that these 3 building blocks automatically generate their DC supply voltage from the Hi and Lo external terminal.

However the invention is as well applicable to these situations where Hi and Lo terminals carry a normal DC voltage. The 3 main building blocks are thus coupled between these two external terminals T1 and T2, whereby an output terminal OUT1 of the first transconductance circuit gm1, is coupled to an input terminal of the second transconductance circuit gm2 and to a first terminal of a capacitor C1. The other terminal of this capacitor is coupled to the external terminal which is biased to the lowest voltage by the active inductor circuit. An output terminal OUT2 of the second transconductance circuit gm2 is coupled to an input terminal of a feedback circuit fb, an output terminal of which is coupled to an input terminal IN1 of the first transconductance circuit gm1. The first and second transconductance circuits, together with the capacitor C1 thereby provide the inductance, as will be shown in a further paragraph, while the feedback circuit fb is such as to provide an appropriate bias for the first transconductance circuit gm1, thereby achieving a linear relationship between the voltage between the two inductance terminals T1 and T2, and consequently the voltage between the two external terminals Hi and Lo, being denoted as Vhi and Vlo, and the output current through the second transconductance circuit.

The complex relationship using Laplace parameters s between the AC voltage Vout1 at node OUT 1 and the difference between the AC voltage at terminals Hi and Lo, denoted by Vhi-Vlo is given by:

$$Vout1 = gm1*(Vhi-Vlo)*1/(s.C1) \quad (1)$$

With gm1 in this formula also denoting the value of the transconductance of the circuit gm1, and s being the Laplace variable.

The relationship between the AC current I through the second transconductance circuit gm2, and the voltage Vout1 is given by:

$$I = gm2*Vout1 = gm2*gm1.(Vhi-Vlo)/(s.C1) \quad (2)$$

With gm2 in this formula also denoting the value of the transconductance of the circuit gm2.

The equivalent impedance is thus given as $$Z = s.C/(gm1*gm2) \quad (3)$$

Resulting in an equivalent inductance given by the capacitance value divided by the product of both transconductance values gm1 and gm2 of the same named transconductance circuits.

Figure 2:
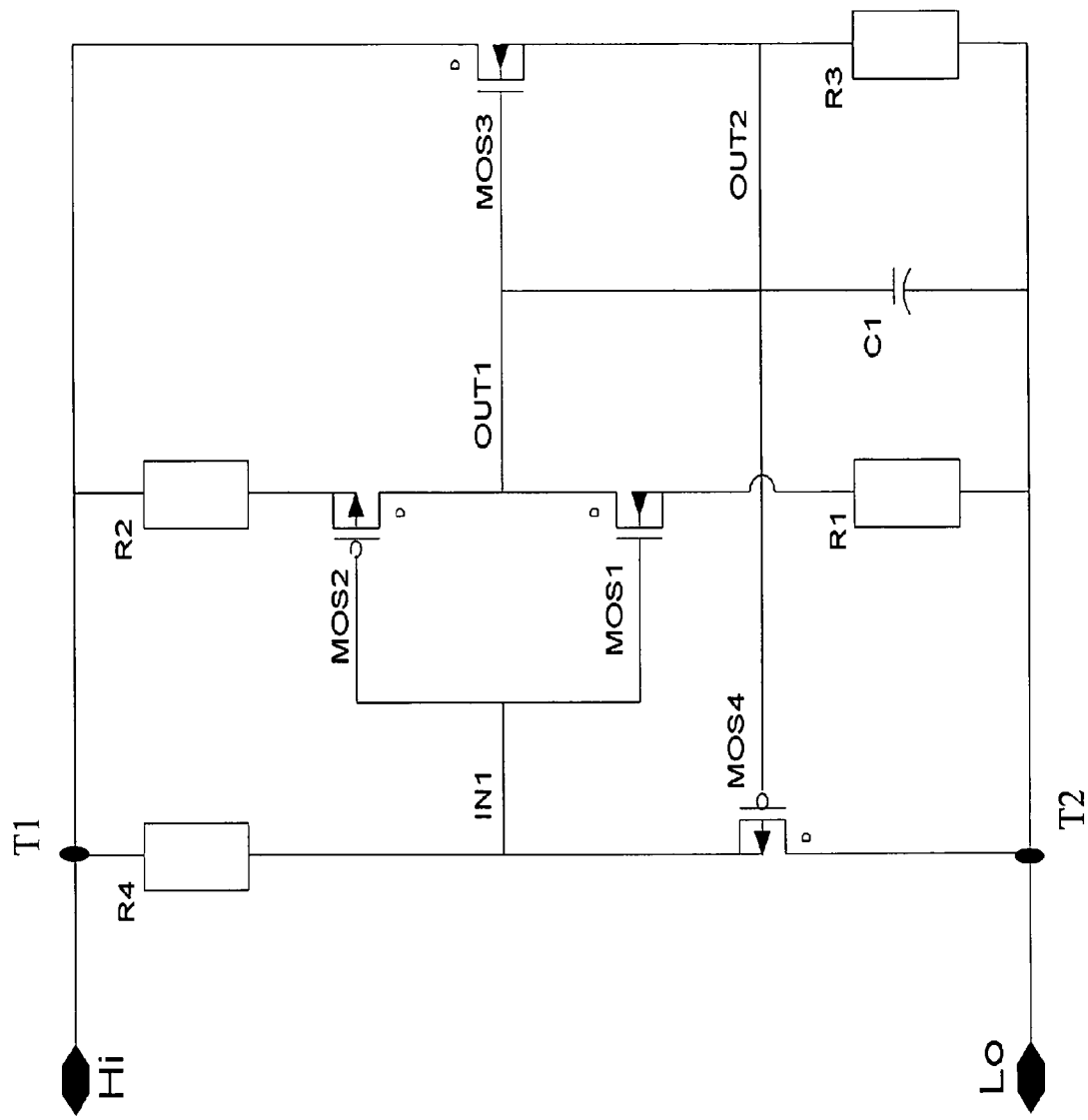

A simple MOS transistor level implementation of such an active inductance circuit is shown in FIG. 2. It is to be remarked that although an implementation in CMOS (complementary metal oxide semiconductor) technology is shown, this scheme may as well be implemented in other types of semiconductor technologies such as bipolar or III–V technologies, or even using other types of active devices. The MOS transistors of a specific type are then to be replaced by the appropriate active devices such as to realise equivalent embodiments in other types of technologies. In the remainder of this description we will proceed with the description of an implementation using CMOS technology.

The first transconductance circuit gm1 thereby includes an invertor consisting of transistors MOS1 and MOS2. MOS1 is an nMOS transistor, a drain of which is coupled to the drain of pMOS transistor MOS2. In order to linearise and to reduce the transconductance, resistors R1 and R2 are put in series to MOS 1 and MOS2 respectively, as shown in FIG. 2. The control terminals of MOS1 and MOS2 are coupled together.

The second transconductance circuit gm2 simply consists of a third transistor MOS3 in series with a resistor R3, this transistor MOS3 being an nMOS transistor, the source of which is coupled via a resistor R3 to the lower supply terminal. The control terminal of MOS3 is thereby coupled to the output terminal of the invertor of gm1, being the junction point between the drain terminals of transistors MOS1 and MOS2.

The feedback circuit fb is coupled between the source terminal of MOS 3, constituting in this embodiment the output terminal OUT2 of gm2, and the input terminal IN1 of the first transconductance circuit gm1, which corresponds to the inverter input terminal. To this purpose the source of MOS 3 is coupled to the gate of a fourth transistor MOS4, being a pMOS transistor, a source terminal of which is coupled via a fourth resistor R4 to the first inductor terminal. This feedback circuit mainly serves to properly bias the invertor of gm1 such as to guarantee its switchover point, and to linearize the relationship between the synthesised DC voltage between T1 and T2 and the DC output current through gm2, as will be shown in the next paragraph.

Let VHL be the DC drop between the terminals Hi and Lo. Let VGS1, VGS2, VGS3, VGS4 be the gate-source voltages of respectively MOS1, MOS2, MOS3, MOS4. The switchover voltage of the inverter is equal to:

$$V_{switchover} = \frac{R2*V_{GS1} + R1*V_{GS2} + R1*VHL}{R1+R2} \quad (4)$$

The switchover voltage can also be written in function of the DC output current IOUT through MOS 3:

$$V_{switchover} = I_{OUT}*R3 + V_{GS4} \quad (5)$$

Using the previous two equations, the DC voltage drop VHL across the circuit can be calculated:

$$VHL = (I_{OUT}*R3 + V_{GS4})*\left(1 + \frac{R2}{R1}\right) - \frac{R2}{R1}*V_{GS1} - V_{GS2} \quad (6)$$

It should be noted that if the inverter is symmetrical, VHL is equal to:

$$VHL = 2*(I_{OUT}*R3 + V_{GS4}) \quad (7)$$

From formula's (6) and (7) it is clear that, by means of the feedback circuit, the DC voltage drop between the inductor terminals T1 and T2 varies linearly as a function of the DC output current IOUT, since VGS4 is independent from IOUT. In the absence of the feedback circuit, the relationship between VHL and IOUT would be quadratic. Thanks to the presence of the feedback circuit, the relationship between VHL and IOUT is now linear by means of the feedback which divided this quadratic relationship by its own linear open-loop transferfunction. This results in a linearisation of the relationship between VHL and IOUT, which constitutes an important asset of this invention.

The AC behaviour and associated equivalent AC impedance will now be calculated.

Let gmn and gmp be the transconductances of transistor MOS1 respectively MOS2. Let gmfol be the transconductance of transistor MOS3. Let gmfb be the transconductance of MOS4.

It may be calculated that the transconductance gm1 of the gm1-building block comprising transistors MOS1 and MOS2 and resistors R1 and R2 is given by:

$$gm1 = \frac{1}{\frac{1}{gmp} + R2} \quad (8)$$

and that gm2 is given by $$gm2 = \frac{1}{\frac{1}{gmfol} + R3} \quad (9)$$

Let vhilo be the difference between the AC voltage at terminals Hi and Lo. Let vin1 be the AC voltage on node IN1. Let vout1 be the AC voltage on node OUT1. Observing these relations, the Kirchoff Current law on node OUT1 gives the following expression:

$$\frac{v_{hilo} - v_{in1}}{R2 + \frac{1}{gmp}} - \frac{v_{in1}}{R1 + \frac{1}{gmn}} - \frac{v_{out1} * (sCR_0 + 1)}{R_0} = 0 \quad (10)$$

wherein $R_0$ represents the equivalent AC output impedance of the inverter consisting of MOS1 and MOS2.

Let iout be the AC output current through MOS 3. This current is much larger than the current through the other stages by the choice of the resistor values of R1 to R4 so that:

$$i_{out} = gm2 * v_{out1} \quad (11)$$

Define the factor β as $$\beta = \frac{gmfol * R3}{gmfol * R3 + 1} * \frac{gmfb * R4}{gmfb * R4 + 1} \quad (12)$$

The relation between vin1 and vout1 is given by:

$$v_{in1} = \beta * v_{out1} \quad (13)$$

The equivalent impedance Z realised by the total circuit is then given by the following formula:

$$Z = \frac{\left(\frac{1}{gmp} + \frac{1}{gmn} + R1 + R2\right) * \beta}{gm2 * \left(\frac{1}{gmn} + R1\right)} + \frac{1}{R_0 * gm1 * gm2} + s * \frac{C}{gm1 * gm2} \quad (14)$$

Compared with formula (3) it can be observed that for this particular embodiment the equivalent AC impedance consists of the series connection of an equivalent inductor, given by the last term of the above formula (14) and an equivalent resistor given by the first two terms of the above formula (14).

In 2 typical embodiments following values were selected for the respective transistors and resistors:

R1=R2=15 Kohm; 30 Kohm
R3=2; 4 Ohm
R4=3; 10 Kohm
MOS 1: NMOS with transistor width w/Length L=10 um/3.5 um; 13 um/7 um
MOS2: pMOS with w/l=30 um/3.5 um; 42 um/7 um
MOS3: 300 NMOS in parallel with w/l 150 um/5 um; 300 NMOS in parallel with w/l 150 um/5 um
MOS 4: pMOS with w/l=125/70 um; 32/0.35 um
C1=10 nF The current through MOS3 is deliberately made much larger than the current through the other transistors by selecting the value for R3 to be a factor 1000 to 10000 smaller than the values for the other resistors. MOS3 is very large compared to the other ones, for realising a large gm2 value while still having a length which is large enough for having a large output resistance. This large value in fact determines an upper corner frequency of the ac behaviour of the inductance. For larger values of this output resistance, higher upper corner frequency values are obtained.

It may be observed that the dimensions of MOS 4 may vary considerably; however this does not influence the operation of the circuit since the current through MOS4 is still governed by the value of R4, and since the only factor of importance of MOS4 is its VGS which has to be small enough such that this transistor stays in its saturation mode resulting in a small voltage drop across this transistor.

For the second set of the given values, an equivalent inductance of 5 mH is achieved. The equivalent values for gm1, gm2, gmn and gmp are then respectively 20 uSiemens, 100 mSiemens, 50 uSiemens and 50 uSiemens. The DC voltage between T1 and T2, being VHL then equals 1.7V for a DC output current IOUT of 20 mA. VGS4 is approximately equal to 0.7 V. In Formula (14) the series resistance approximates 10 Ohm, which is mainly due to the first of both terms.

Figure 3:
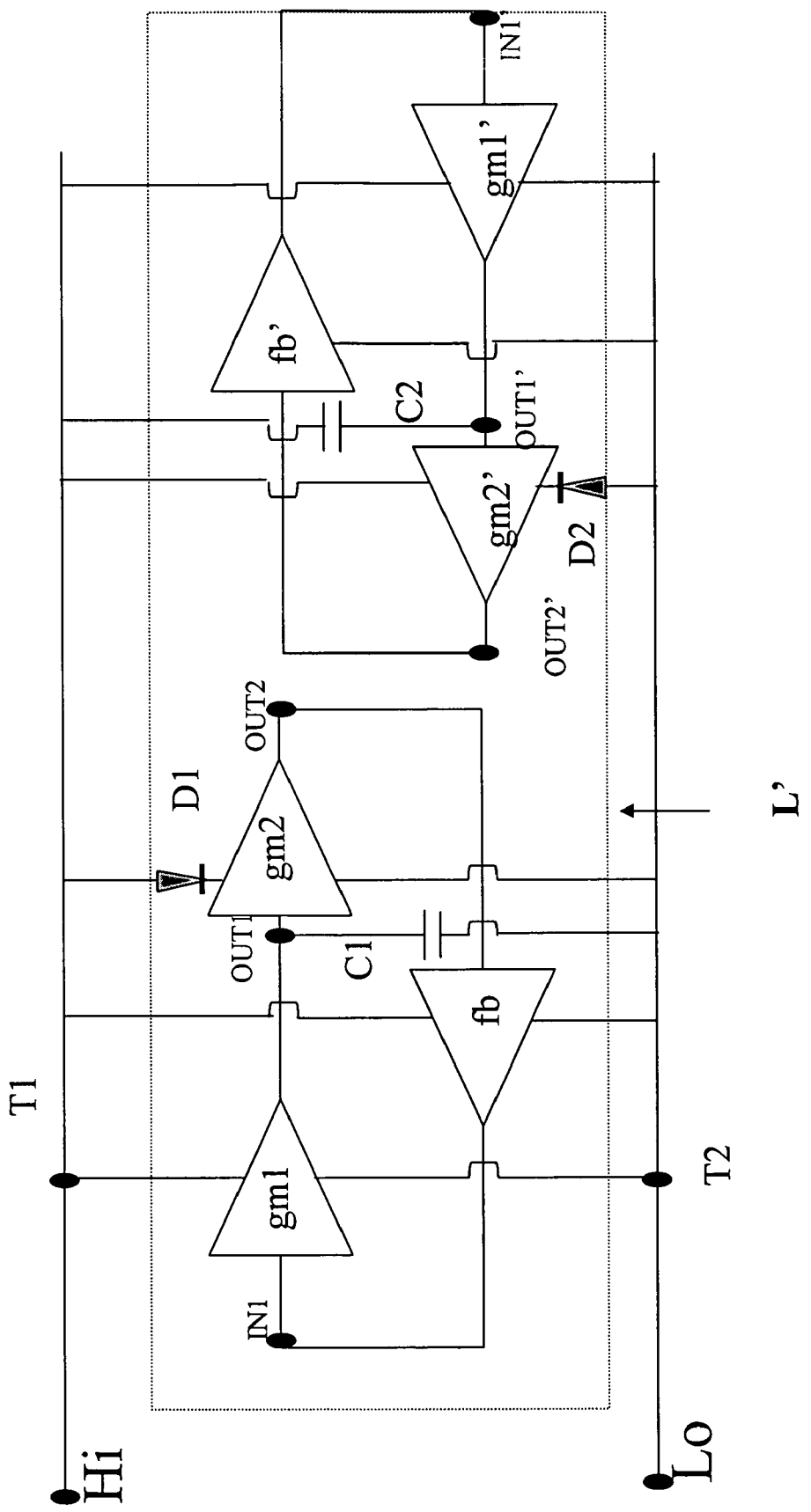

In order to be fully bidirectional, such as to comply with the cases whereby the voltage at the Hi terminal can be lower than the voltage at the Lo terminal, a fully bidirectional variant L' is provided as shown in FIG. 3. This scheme basically includes building blocks of FIG. 1, and a duplicate circuit, but biased in the reverse direction, and consisting of a third transconductance circuit gm1' which is similar to the first one gm1, a fourth transconductance circuit gm2', similar to the second one gm1, and a second feedback circuit fb'. Respective unidirectional devices, denoted D1 and D2, are further provided in the upper supply path to the second transconductance circuit gm2, and in the lower supply path to the fourth transconductance circuit gm2' respectively, as can be further observed from FIG. 3.

Figure 4:
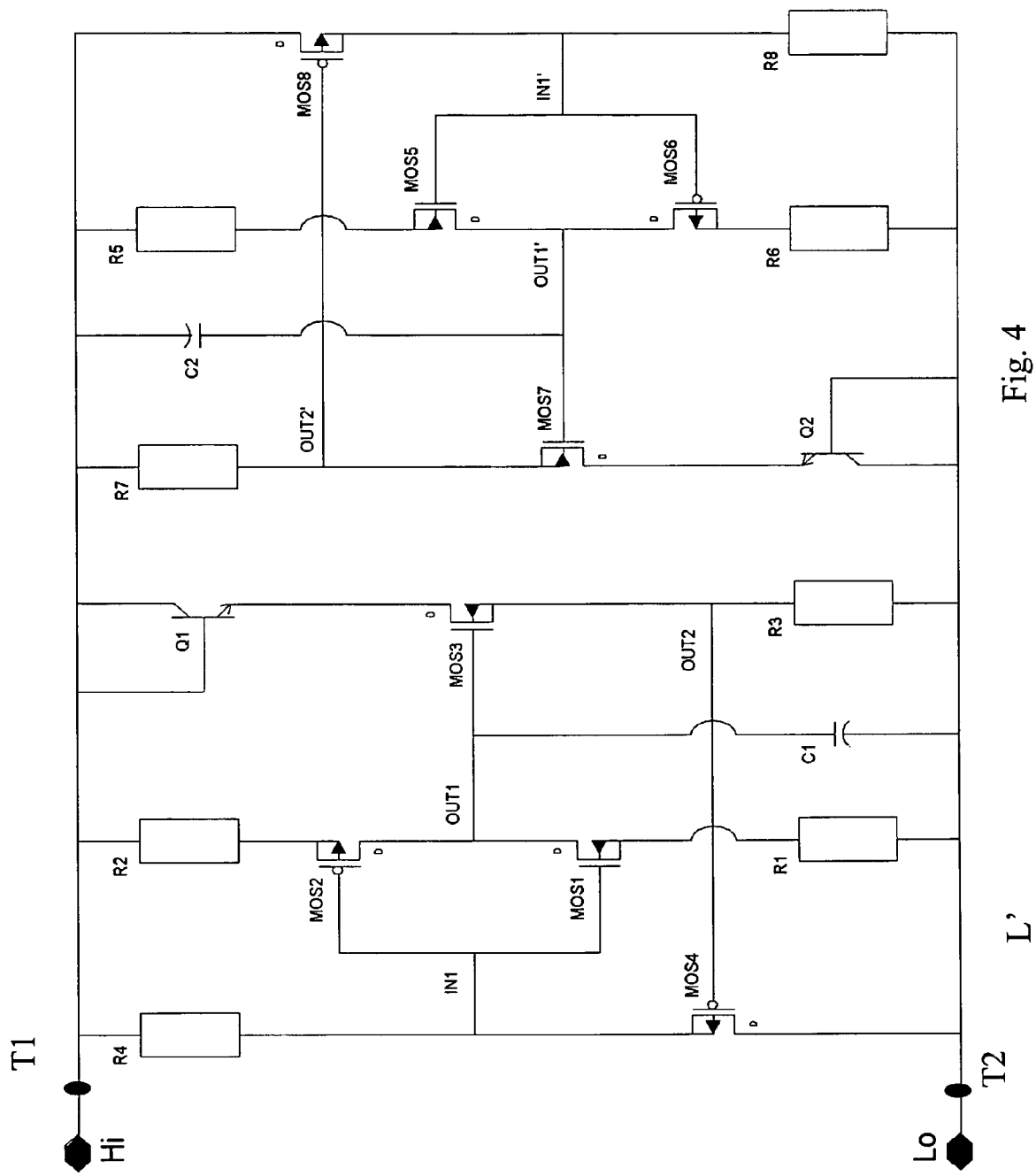
FIG. 4 depicts a transistor-level embodiment of the bidirectional active inductor circuit of FIG. 3.

A transistor level implementation of such a circuit is shown in FIG. 4. This active inductance circuit basically consists of the same devices as shown in FIG. 2, supplemented with their complementary counterparts. Thus an additional invertor consisting of transistors MOS5, MOS6 together with resistors R5 and R6 thereby constitutes an embodiment for the third transconductance circuit. The fourth transconductance circuit consists of pMOS transistor MOS7 in series with resistor R7. The second feedback circuit consists of pMOS transistor MOS8 in series with resistor R8. Furthermore a second capacitor C2 is provided and coupled between the output terminal OUT1' of the third transconductance circuit and terminal T1 of the active inductor circuit. In addition, and such as to guarantee unidirectional current in both half parts, unidirectional devices, in the embodiment of FIG. 4 consisting of bipolar transistors with their collectors coupled to their emitters and denoted Q1 and Q2 are provided, respectively in the supply path of the second and of the fourth transconductance device. This means that Q1 is put in series between terminal T1 and the drain of transistor MOS4, whereas Q2 is put in series between terminal T2 and the drain of pMOS transistor MOS7. In FIG. 4, both unidirectional devices are represented as npn bipolar transistors with their base and collector shorted. However also a diode or another unidirectional current conducting device may be used for this purpose.

In order to guarantee symmetrical operation, the transistors and resistors pertaining to similar functional blocks such as gm1 and gm1', gm2 and gm2' and fb and fb' are dimensioned identically such as to result in similar device characteristics. This results in the same synthesised inductance value in both directions. The formula's derived for the unilateral embodiment of FIG. 2 are still valid as long as MOS 3 stays in its saturation regime. In general the voltage drop acros the equivalent diode is small enough to prevent MOS3 from going out its saturation regime.

Also in this case the same principles as explained in a previous paragraph apply.

While the principles of the invention have been described above in connection with specific apparatus, it is to be clearly understood that this description is made only by way of example and not as a limitation on the scope of the invention, as defined in the appended claims.

The invention claimed is:

1. An active inductor circuit comprising:
   first and second inductor terminals for coupling to respective external terminals, said first and second inductor terminals being coupled to a first transconductance circuit;
   a second transconductance circuit;
   a feedback circuit;
   an output terminal of said first transconductance circuit being coupled to an input terminal of said second transconductance circuit;
   an output terminal of said second transconductance circuit being coupled to an input terminal of said first transconductance circuit via said feedback circuit; and
   a capacitor coupled between said output terminal of said first transconductance circuit and said second inductor terminal,
   wherein said active inductor circuit further includes a third transconductance circuit, an output terminal of which is coupled to an input terminal of a fourth transconductance circuit included in said active inductor circuit, and to a second capacitor, a second terminal of which is coupled to the first terminal of said active inductor circuit, an output terminal of said fourth transconductance circuit being coupled to an input terminal of said third transconductance circuit via a second feedback circuit of said active inductor circuit, said active inductor circuit further including a first unidirectional device coupled between said first terminal and said second transconductance circuit, said active inductor circuit further including a second unidirectional device coupled between said second terminal and said fourth transconductance circuit.

2. An active inductor circuit according to claim 1, wherein said second capacitor is similar to said first capacitor, said third transconductance circuit is similar to said first transconductance circuit, said fourth transconductance circuit is similar to said second transconductance circuit, and said second feedback circuit is similar to said first feedback circuit.

3. An active inductor circuit comprising:
   first and second inductor terminals for coupling to respective external terminals, said first and second inductor terminals being coupled to a first transconductance circuit;
   a second transconductance circuit;
   a feedback circuit;
   an output terminal of said first transconductance circuit being coupled to an input terminal of said second transconductance circuit;
   an output terminal of said second transconductance circuit being coupled to an input terminal of said first transconductance circuit via said feedback circuit; and
   a capacitor coupled between said output terminal of said first transconductance circuit and said second inductor terminal,
   wherein said first transconductance circuit includes an inverter, a first resistor, and a second resistor, and
   wherein said second transconductance circuit includes an active device in series with a third resistor.

4. The active inductor circuit according to claim 3, wherein said feedback circuit includes a fourth resistor in series with a fourth active device.

5. An active inductor circuit comprising:
   first and second inductor terminals for coupling to respective external terminals, said first and second inductor terminals being coupled to a first transconductance circuit;
   a second transconductance circuit;
   a feedback circuit;
   an output terminal of said first transconductance circuit being coupled to an input terminal of said second transconductance circuit;
   an output terminal of said second transconductance circuit being coupled to an input terminal of said first transconductance circuit via said feedback circuit; and
   a capacitor coupled between said output terminal of said first transconductance circuit and said second inductor terminal,
   wherein the feedback circuit linearises the relationship between a synthesised DC voltage between said first and second terminals and a DC output current through said second transconductance circuit.

6. An active inductor circuit comprising:
   first and second inductor terminals for coupling to respective external terminals, said first and second inductor terminals being coupled to a first transconductance circuit;
   a second transconductance circuit;
   a feedback circuit;
   an output terminal of said first transconductance circuit being coupled to an input terminal of said second transconductance circuit;
   an output terminal of said second transconductance circuit being coupled to an input terminal of said first transconductance circuit via said feedback circuit; and
   a capacitor coupled between said output terminal of said first transconductance circuit and said second inductor terminal,
   wherein the current through said second transconductance circuit is at least a factor 100 larger than the current through said first transconductance circuit and through said feedback circuit.

7. An active inductor circuit comprising:
   first and second inductor terminals for coupling to respective external terminals, said first and second inductor terminals being coupled to a first transconductance circuit;
   a second transconductance circuit;
   a feedback circuit;
   an output terminal of said first transconductance circuit being coupled to an input terminal of said second transconductance circuit;
   an output terminal of said second transconductance circuit being coupled to an input terminal of said first transconductance circuit via said feedback circuit; and
   a capacitor coupled between said output terminal of said first transconductance circuit and said second inductor terminal,
   wherein the equivalent inductance equals the capacitance value of said first capacitor divided by the product of the transconductance values of said first transconductance circuit and said second transconductance circuit.

* * * * *